(12) United States Patent
Kim et al.

(10) Patent No.: US 8,830,697 B2
(45) Date of Patent: Sep. 9, 2014

(54) GROUND STRUCTURE OF CONNECTOR FOR PORTABLE TERMINAL

(75) Inventors: Hyung Wook Kim, Suwon-si (KR); Byung Kuk Ko, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 645 days.

(21) Appl. No.: 12/925,079

(22) Filed: Oct. 13, 2010

(65) Prior Publication Data

US 2011/0085315 A1 Apr. 14, 2011

(30) Foreign Application Priority Data

Oct. 13, 2009 (KR) ........................ 10-2009-0097348

(51) Int. Cl.
  *H05K 9/00* (2006.01)
  *H05K 5/02* (2006.01)
  *H01R 13/648* (2006.01)
  *H05K 7/14* (2006.01)

(52) U.S. Cl.
  USPC ............ 361/816; 174/51; 174/350; 174/357; 174/358; 174/359; 174/377; 361/800; 361/818

(58) Field of Classification Search
  USPC .................................. 174/51, 350, 357–359; 455/575.1–575.4; 361/753, 799, 800, 361/814, 816, 818; 439/607.04
  See application file for complete search history.

(56) References Cited

U.S. PATENT DOCUMENTS

| | | | |
|---|---|---|---|
| 6,095,862 A * | 8/2000 | Doye et al. ............... | 439/607.11 |
| 6,206,730 B1 * | 3/2001 | Avery et al. .............. | 439/607.18 |
| 6,242,690 B1 * | 6/2001 | Glover .......................... | 174/387 |
| 6,287,146 B1 * | 9/2001 | Avery et al. ................ | 439/607.4 |
| 6,344,978 B1 * | 2/2002 | Komiya ........................ | 361/816 |
| 6,465,738 B2 * | 10/2002 | Yumi .......................... | 174/84 R |
| 7,787,255 B2 * | 8/2010 | Tsai et al. ..................... | 361/753 |
| 2002/0088629 A1 * | 7/2002 | Jeon ............................ | 174/35 R |
| 2009/0120682 A1 * | 5/2009 | Ohtsuji et al. ................ | 174/359 |
| 2010/0041273 A1 * | 2/2010 | Scherer et al. ........... | 439/607.01 |

* cited by examiner

*Primary Examiner* — Timothy Thompson
*Assistant Examiner* — Sherman Ng

(57) ABSTRACT

A ground apparatus for connecting components for a portable terminal suppresses the occurrence of noise by grounding a connector. The ground apparatus includes a connector engaging portion at one side of a main board. A connector that includes a grounding portion is inserted into the connector engaging portion. A shield can is disposed to cover at least at part of the main board. The shield can includes a ground structure formed at the connector engaging portion area to enclose the connector and electrically couple the ground structure with the ground portion of the connector.

20 Claims, 4 Drawing Sheets

GROUND STRUCTURE OF CONNECTOR FOR PORTABLE TERMINAL

CROSS-REFERENCE TO RELATED APPLICATION(S) AND CLAIM OF PRIORITY

The present application is related to and claims the benefit under 35 U.S.C. §119(a) of a Korean patent application filed in the Korean Intellectual Property Office on Oct. 13, 2009 and assigned Serial No. 10-2009-0097348, the entire disclosure of which is hereby incorporated by reference.

TECHNICAL FIELD OF THE INVENTION

The present invention relates to a portable terminal and, more particularly, to a ground structure connecting a display unit of the portable terminal to a main board.

BACKGROUND OF THE INVENTION

Because portable terminals can provide various user functions (e.g., a mobile communication function, a game function, and a scheduling function while maintaining mobility) they have attracted many users.

Simultaneously, because a portable terminal should basically provide mobility, it should be small. In order to satisfy users' various preferences, a variety of designs should be provided. A number of components can be mounted in the portable terminal to support various functions. Consequently, there is a need for a design for maximization of a restricted space in a portable terminal.

Meanwhile, in order to make best use of a restricted space and to provide a large amount of information in the portable terminal, the size of a display device tends to be increased. Accordingly, the resolution of the display device is also increased and a large amount of information is displayed on the display device. A conventional portable terminal transfers a large amount of data from a main board to a display device at high speeds to implement images of the display device. However, because the main board and the display device of the portable terminal are disposed in such a way that they are not directly connected to each other, a connector connecting one side of the display device to one side of the main board is provided. The main board can transfer a large amount of data to the display device through the connector. In the meantime, the display device may include a touch panel to provide an input function. Signals generated by the touch panel can be transferred to a control unit mounted at the main board through the connector.

As illustrated above, the conventional portable terminal transmits and receives a large amount of data between the display device and the main board very rapidly. Such a signal flow causes data noise. In particular, a large amount of noise occurs in a connector part connected to the main board. The noise causes errors in or has a bad influence upon peripheral devices, e.g., an antenna pattern, a camera module, or other elements, due to a narrow special restriction. Accordingly, as mentioned above, there is a need for a method for removing noise that occurs in the connector connected to the main board.

SUMMARY OF THE INVENTION

To address the above-discussed deficiencies of the prior art, it is a primary object to provide a ground structure of a connector capable that suppresses the occurrence of noise by grounding a connector connected to one side of a main board in a portable terminal.

In accordance with an aspect of the present invention, a ground apparatus of a connector portion for a portable terminal includes a connector engaging portion provided at one side of a main board. A connector that includes a ground portion is inserted into the connector engaging portion. A shield can is disposed to cover the main board and includes a ground structure formed at the connector engaging portion area to enclose the connector. And a gasket is disposed to cover the ground structure and tightly couple the ground structure to the ground portion of the connector.

In accordance with another aspect of the present invention, a ground apparatus of a connector portion for a portable terminal includes a connector engaging portion provided at one side of a main board. A connector that includes a ground portion is inserted into the connector engaging unit. And a shield can is disposed to cover the main board and includes a ground structure formed at the connector engaging portion region to enclose the connector. The ground structure is electrically connected to the ground portion of the connector.

In the ground structure of a connector for a portable terminal according to an embodiment of the present invention, a noise occurring in a connector connected to a main board may be reduced to support a stable operation of the portable terminal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged connector.

Figure 1:
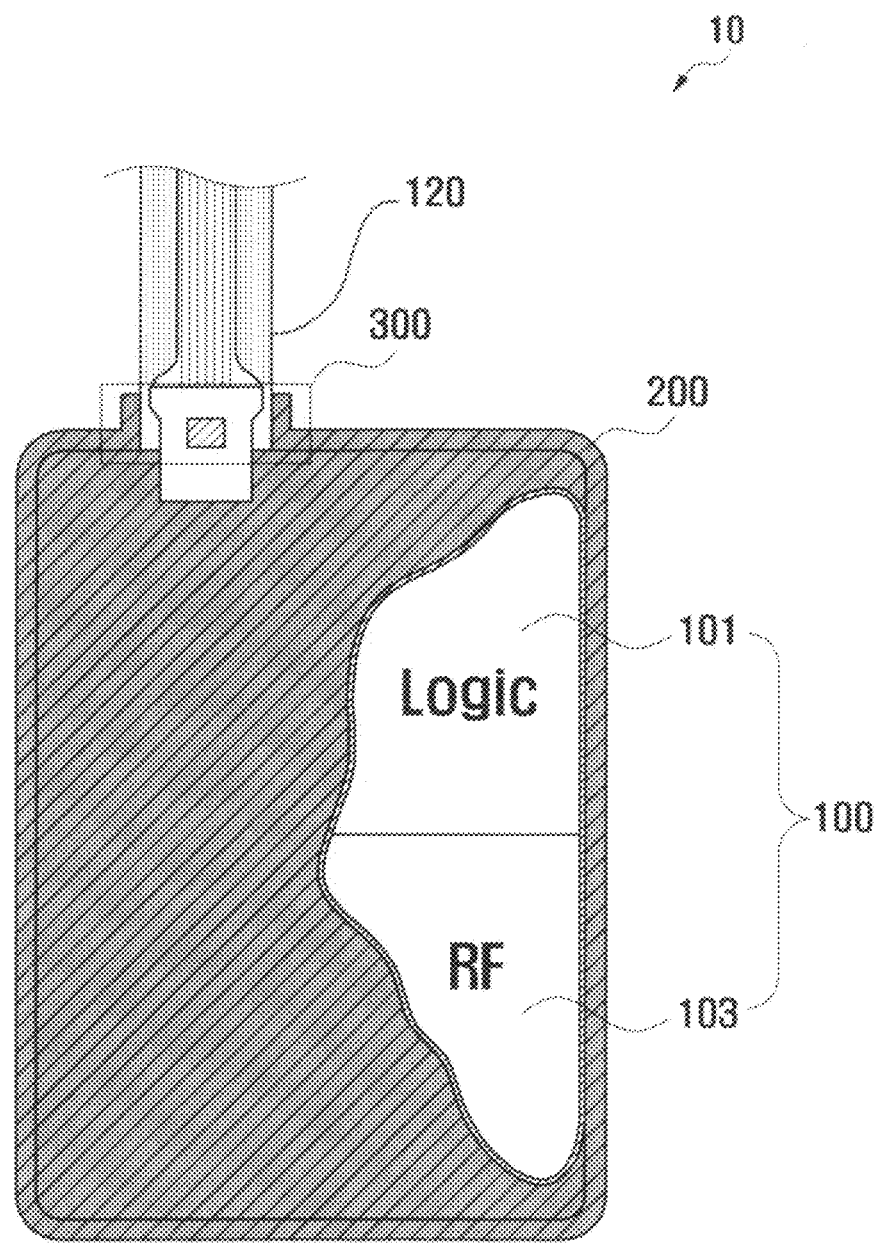
FIG. 1 illustrates a part of a ground structure of a connector for a portable terminal according to an embodiment of the present invention.

FIG. 1 illustrates a part of a ground structure of a connector for a portable terminal according to an embodiment of the present invention. And FIG. 2 illustrates respective structural elements of the ground structure of a connector for the portable terminal shown in FIG. 1.

Figure 2:
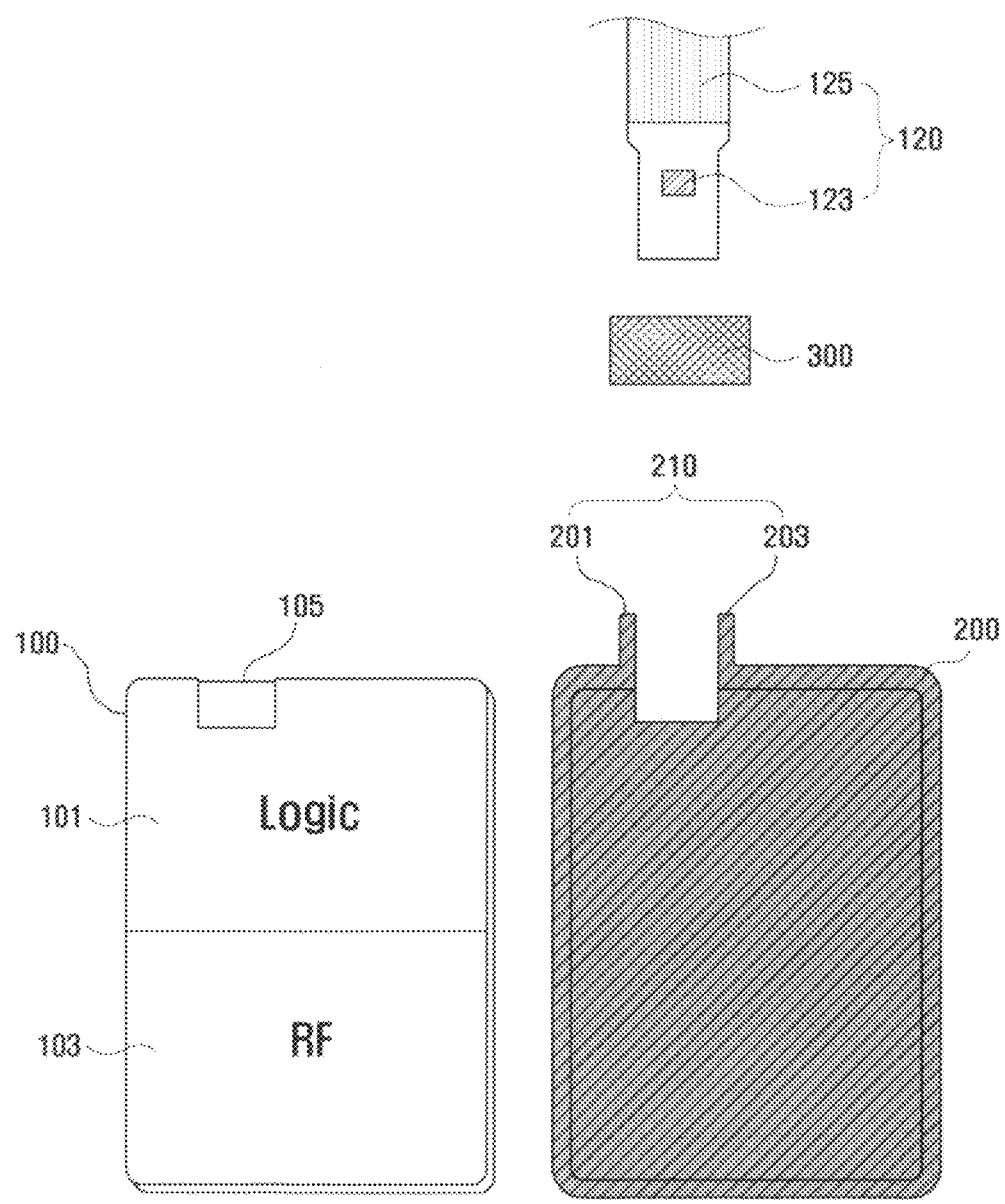
FIG. 2 illustrates respective structural elements of the ground structure of a connector for a portable terminal shown in FIG. 1.

Referring to FIGS. 1 and 2, the portable terminal 10 of the present invention includes a main board 100, a shield can 200, a connector 120, and a conductive gasket 300.

In the portable terminal 100 that includes the construction mentioned above, when the connector 120 is positioned at a connector engaging portion 105 provided at one side of the main board 100, the shield can 200 is disposed to cover an upper portion of the main board 100. The shield can 200 may be provided with a left protrusion 201 protruding from one side thereof and a right protrusion 203 spaced apart from the left protrusion 201 by a given distance parallel with the left protrusion 201. The left protrusion 201 and the right protrusion 203 are disposed at left and right sides of a connector 120 positioned at a connector engaging portion 105, respectively. A conductive gasket 300 formed by a conductive material is disposed to be electrically connected to a ground structure of the connector 120 that extends a ground structure of the connector 120 to an entire area of the shield can 200. Accordingly, the portable terminal 100 uses the shield can 200 as the ground portion 123 of the connector 120 to reduce a noise occurring in a signal transmitted from the main board 100 through the connector 120 and a flexible printed circuit board 125 or a signal transferred to the main board 100 from a display unit (not shown). Hereinafter, a shape and an arrangement of each construction will be described in detail.

The main board 100 includes a control unit for supporting various functions of the portable terminal 100 and can be composed of a logic unit 101 and an RF unit 103. The logic unit 101 executes various operations for supporting user functions of the portable terminal 100. The RF unit 103 includes a modem for supporting a mobile communication service function of the portable terminal 100. The RF unit 103 can connect with an antenna (not shown) for supporting a mobile communication service function. The main board 100 can be implemented with a printed circuit board (PCB). A connector engaging portion 105 is formed at one side of the main board 100. The connector 120 is positioned at the connector engaging portion 105 for transmitting data to a display unit (not shown). The connector engaging portion 105 provided at the main board 100 can be manufactured in a form engaged by pressure that the connector 120 applies to the connector engaging portion 105. In an embodiment of the present invention, the connector engaging portion 105 is provided at one side of the logic unit 101. However, the present invention is not limited thereto. That is, the connector engaging portion 105 of the present invention can be provided at one side of the RF unit 103. The RF unit 103 of the main board 100 can be disposed at a location that can connect with the connector 120. Here, FIGS. 1 and 2 show that the logic unit 101 is disposed at an upper portion of the main board 100 and the RF unit 103 is disposed at a lower portion of the main board 100. However, the logic unit 101 may be disposed at the lower portion of the main board 100 and the RF unit 103 may be disposed at the upper portion of the main board 100. When the connector engaging portion 105 is provided at the RF unit 103, a signal line that connects the connector engaging portion 105 and the logic unit 101 can be further provided in the main board 100.

The shield can 200 is formed to cover at least a part of an entire surface of the main board. The shield can 200 may be made of a stainless material that is a conductive material or a specific grade of stainless steel. The shield can 200 may include a ground structure 210 provided at one side thereof to enclose the connector 120. For example, when the connector engaging portion 105 is provided at an upper left end of the main board 100, the ground structure 210 enclosing the connector 120 of the shield can 200 may include a left protrusion 201 and a right protrusion 203. The left protrusion 201 extends from an adjacent area of a left side of the connector engaging portion 105 to have a given length upward. The right protrusion 203 extends from an adjacent area of a right side of the connector engaging portion 105 to have a given length upward.

One side of the connector 120 engages with the connector engaging portion 105 provided at the main board 100, and another side of the connector 120 connects with a flexible PCB 125. When a given number of holes are formed at an entire surface of the connector engaging portion 105, the connector 120 may include pins that can be inserted into the holes. The holes provided at the connector engaging portion 105 can be a structure that is electrically coupled to certain signal lines of the logic unit 101. Accordingly, the portable terminal 10 may include an arrangement such that the logic unit 101 may transmit a signal to the connector 120 engaging with the connector engaging portion 105. Further, the connector 120 can be manufactured in various forms. When a given physical force is substantially applied to the connector engaging portion 105 and the connector 120, the connector 120 may have a structure engaging in a tight fitting form. A ground portion 123 can be provided at an outer portion of the connector 120. The connector 120 may have a part coated with an insulation material around the outer portion at which the ground portion 123 is provided to prevent the occurrence of an electric contact in an area except for the ground portion 123. When the outer portion of the connector 120 is coated with the insulation material, the connector 120 preferably exposes the ground portion 123 to electrically connect at least one side to a conductive gasket 300. Meanwhile, a flexible PCB 125 is disposed at another side of the connector 120. On one end of the flexible PCB 125, which is provided at another side of the connector 120, is a circuit board that is coupled to the respective signal lines provided at the connector 120. Another side of the flexible PCB 125 is electrically coupled to a display unit (not shown) such that the flexible PCB 125 transfers various data provided from the logic unit 101 to the display unit.

The conductive gasket 300 encloses the connector 120 and the left protrusion 201 and right protrusion 203 (being a ground structure 210 of the shield can 200) when connector 120 is engaged with the shield can 200. Assuming that a front case and a rear case substantially constituting the portable terminal 100 are provided, a main board 100 may be disposed at the rear case and a display unit may be disposed at the front case. Accordingly, the portable terminal 100 may have a structure that fixes the main board 100 to the rear case by inserting the connector 120 in the connector engaging portion 105 of the main board 100 after placing the main board 100 at the rear case, placing the shield can 200 to cover an upper portion of the main board 100, and fixing the shield can 200 to the rear case by screw engagement.

When the portable terminal 10 has the foregoing structure, the conductive gasket 300 may be provided at one side of front case. When the front case and the rear case engage with each other, the conductive gasket 300 is disposed a connecting portions of the ground structure 210 of the shield can 200 and the connector 120. The conductive gasket 300 is formed of a conductive material, and electrically connects the left protrusion 201 and the right protrusion of the ground structure 210 to the ground portion 123 of the connector 120. As a result, as the conductive gasket 300 is electrically connected to the left protrusion 201 and the right protrusion 203, the ground portion 123 provided at the outer portion of the connector 120 can extend a ground area of the connector 120 to the shield can 200. In the meantime, the conductive gasket 300 presses the ground structure 210 of the shield can 200 by engagement between the rear case and the front case to tightly contact with the ground structure 210 of the shield can 200 and the ground portion 123 of the connector 120.

As illustrated previously, the portable terminal 100, according to an embodiment of the present invention provides a ground structure 210 and a conductive gasket 300 grounding a connector 120 connecting a display unit to a main board 100 to the shield can 200 to reduce noise occurring in the connector 120.

Meanwhile, the left protrusion 201 and the right protrusion 203 may be formed to enclose both sidewalls of the connector 120 to prevent movement of the connector 120 after the connector 120 engages with the connector engaging portion 105. For example, the left protrusion 201 can be formed to enclose at least a part of an edge area of a left sidewall of the connector 120, and the right protrusion 203 can be formed to enclose at least a part of an edge area of a right sidewall of the connector 120.

Figure 3:
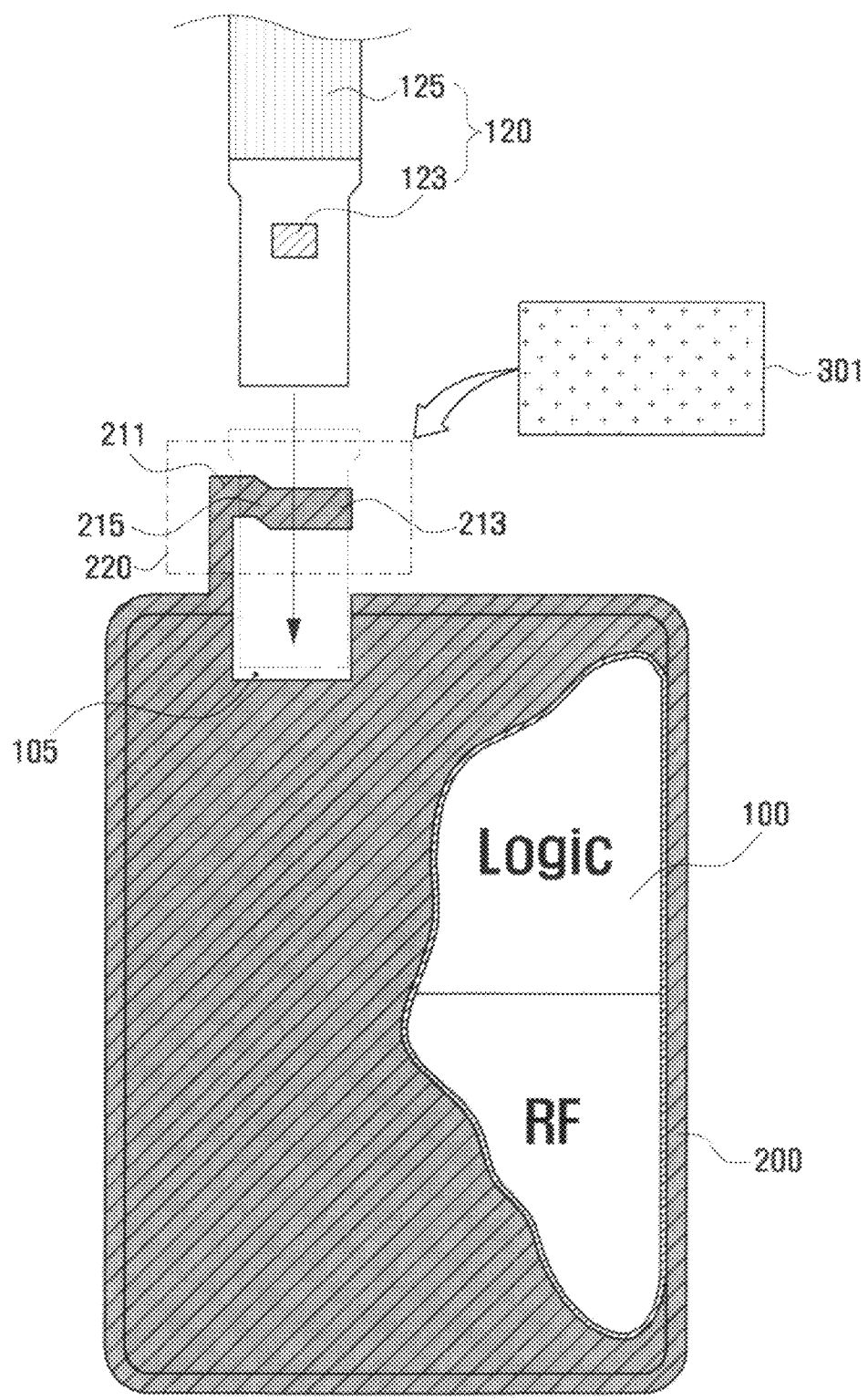
FIG. 3 illustrates a ground structure of a connector for a portable terminal according to an embodiment of the present invention.

FIG. 3 illustrates a ground structure of a connector for a portable terminal according to an embodiment of the present invention.

Referring to FIG. 3, a portable terminal 10 of the present invention includes a main board 100, a shield can 200, a connector 120, and a fixed gasket 301 formed of a non-conductive material. Here, the main board 100 and the connector 120 of FIG. 3 have the same constructions as those of the main board 100 and the connector 120 shown in FIG. 2, and thus the detailed description thereof is appropriately omitted.

The shield can 200 encloses an entire surface of the main board 100. When the connector 120 is inserted in a connector engaging portion 105 provided at the main board 100, the shield can 200 includes a ground structure 220 that is electrically connected to the ground portion of the connector 120. The ground structure 220 includes: a reference protrusion 211 that extends from a given area of an upper sidewall of the shield can 200, at which the connector engaging portion 105 is located, to a direction that is opposite from an insertion direction of the connector 120 in the connector engaging portion 105; a sidewall extension portion 215 that initially extends from an end of the reference protrusion 211 in a direction substantially perpendicular to the insertion direction of the connector 120 to form a given angle such that a hook shape is formed by the reference protrusion 211 and the sidewall extension portion 215; and a ground extension portion 213 that extends from an end of the sidewall extension portion 215 in a direction perpendicular to the insertion direction of the connector 120 such that the ground extension portion 213 is in contact with the ground portion 123 when the connector 120 is inserted into the connector engaging portion 105.

Accordingly, when the connector is inserted into the connector engaging portion 105, the reference protrusion 211 is disposed parallel with a left sidewall of the connector 120, and the sidewall extension portion 215 is disposed to form a given angle with the left sidewall of the connector 120, for example, perpendicular to the left sidewall of the connector 120. The ground extension portion 213 can be disposed at a left sidewall of the connector 120 in a direction contacting with the ground portion 123 of the connector 120. Consequently, as the ground extension portion 213 contacts with the ground portion 123 of the connector 120 and is electrically connected to an entire area of the shield can 200 through the sidewall extension portion 215 and the reference protrusion 211, the ground structure 220 extends a ground area of the connector 120 to the entire area of the shield can 200.

As described earlier, the shield can 200 can be formed of a stainless material or a specific grade of stainless steel. A projection can be further provided at one side of the ground extension portion 213. Namely, a projection may be further provided at a facing surface of the ground extension portion 213 with respect to the ground portion 123 to firmly support an electric contact with the ground portion 123.

Moreover, the ground extension portion 213 may include a bending portion. The bending portion has a surface facing the ground portion 123. At least a part of the surface of the bending portion is bent. Upon insertion of the connector 210, the ground extension portion 213 is supported by the sidewall extension portion 215 to have an elasticity of given strength. The elasticity acts to a direction of the ground portion 123 of the connector 120 to tightly contact with the ground portion 123 by itself.

The fixed gasket 301 can be formed of a non-conductive material such as PORON® (PORON is a licensed trademark of Rogers Corporation). The fixed gasket 301 can be disposed at a front case other than a rear case at which a shield can 200 is disposed in one side of the portable terminal 10 that includes an engagement structure of the rear case and the front case. The fixed gasket 301 can be configured to press against a ground structure 220 of the shield can 200 according to engagement of the cases. That is, the fixed gasket 301 may be configured to press against the ground extension portion 213 such that the ground extension portion 213 tightly contacts with the ground portion of the connector 120.

The fixed gasket 301 can be formed of a conductive material as well as a non-conductive material. In an embodiment, the fixed gasket 310 formed of a conductive material may tightly support the electrical connection between the ground portion 123 of the connector 120 to the ground structure 220, and extend a ground area of the ground portion 123.

Because the ground structure 220 for a portable terminal 100, according to an embodiment of the present invention, may extend a ground area of the ground portion 123 of connector 120 to a shield can 200 without changing a conventional process or materials used to manufacture a fixed gasket 301, the ground structure can reduce a noise occurring in a connector 120 inserted in a main board without additional processes or increasing a material cost.

Figure 4:
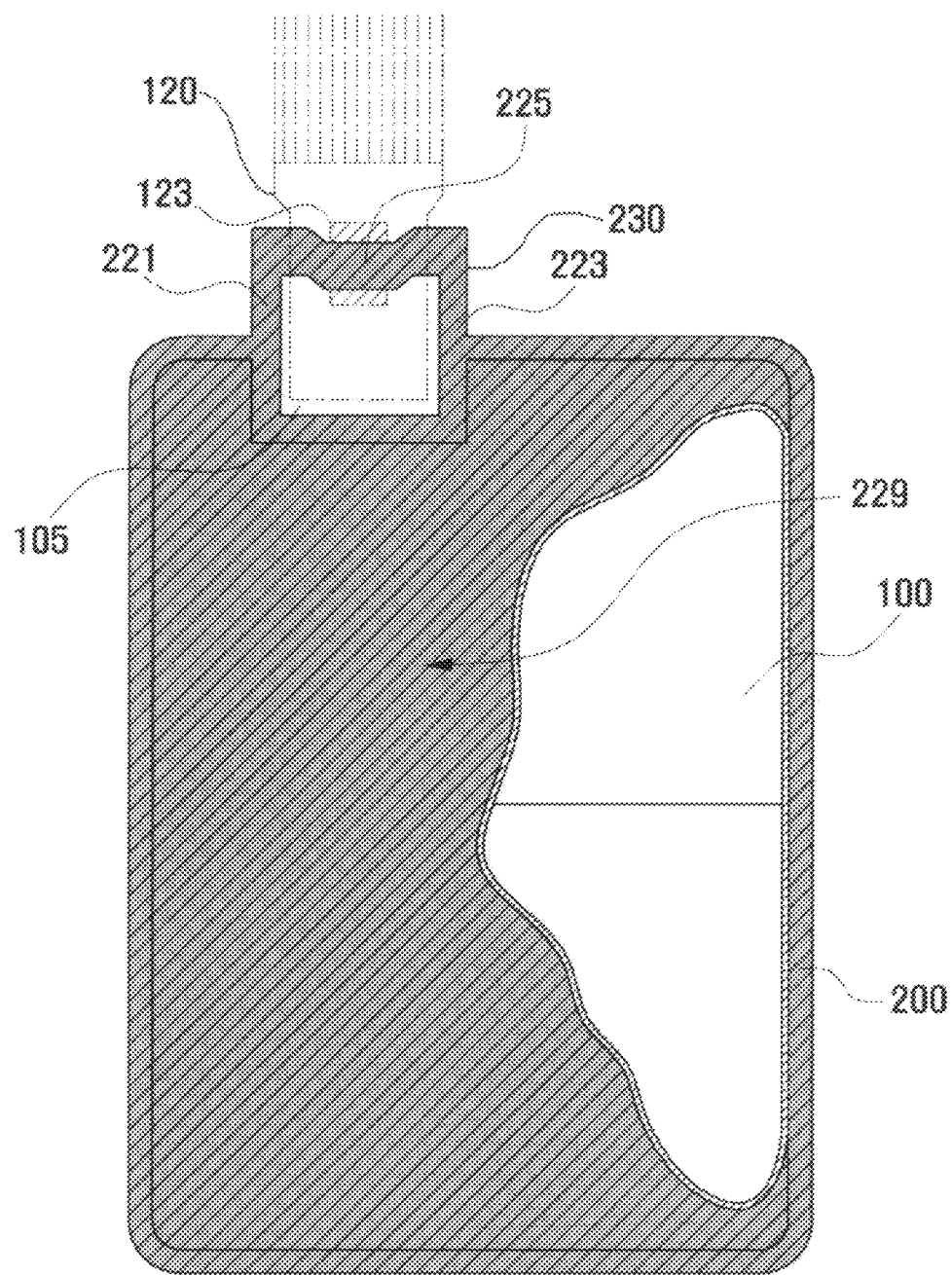
FIG. 4 illustrates a shield can of a portable terminal according to an embodiment of the present invention.

FIG. 4 illustrates a shield can structure of a portable terminal according to an embodiment of the present invention.

Referring to FIG. 4, a shield can 200 includes an outer substrate 229 formed to cover an entire surface of a main board 100, and a ground structure 230 that makes contact with a ground portion 123 of the connector 120 at one side of the shield can 200.

The ground structure 230 includes: a left extension portion 221 that extends in a direction opposite from an insertion direction of the connector 120 in the main board 110; a right extending portion 223 that extends in a parallel direction with respect to the left extending portion 221 and spaced apart from the left extending portion 221; and a ground connecting portion 225 that connects the right extending portion 223 to the left extending portion 221 and makes contact with the ground portion 123 of the connector 120 when the connector 120 engages with the connector engaging portion 105. Here, when the connector 120 is inserted into the main board 100, the left extending portion 221 is disposed parallel to a left sidewall of the connector 120. Meanwhile, when the connector 120 is inserted into the main board 100, the right extending portion 221 is disposed parallel to a right sidewall of the connector 120.

In an embodiment, the ground connecting portion 225 includes a left sub-extending portion extending from an end of the left extending portion 221 perpendicular to a left sidewall of the connector 120 by a given height; a right sub-extending portion extending from an end of the right extending portion 223 to be spaced from the left sub-extending portion by a width of the connector 120 in a direction perpendicular to a right sidewall of the connector 120 by a given height; and a ground joint that connects the left sub-extending portion and the right sub-extending portion.

When the connector 120 substantially engages with the connector engaging portion 105, the ground joint contacts with a ground portion 123 of the connector 120. Accordingly, because the ground structure 230 electrically connects the ground portion 123 of the connector 120 to the ground joint and electrically connects the ground joint to an entire area of a shield can 200, it may extend a ground area of the connector 120 to the entire area of the shield can 200 to thereby improve grounding.

Moreover, when the connector 120 is inserted into the connector engaging portion 105 of the main board 100, the ground structure 230 may fix the connector 120 by a ground joint to prevent the connector 120 from moving. A projection can be further provided at one side of the ground joint. That is, the projection of the ground joint may be formed in a direction facing the ground portion 123 of the connector 120 to tightly support an electric contact between the ground joint and the ground portion 123. In addition, the ground joint may be bent to a direction of the ground portion 123 to tightly support an electric contact with the ground portion 123.

In an embodiment of the present invention as mentioned above in FIGS. 2 and 3, a gasket fixing a ground structure 230 of the shield can 200 can be provided. The gasket may be provided when the shield can 200 is not disposed to press the ground structure 230 by a bonding force of a case. A ground structure 230 is formed at the shield can 200. Accordingly, the ground structure 230 can tightly contact with a ground portion 123 of the connector 120. Although the gasket is formed by one of a conductive material or a non-conductive material, it can provide support to tightly maintain the connection between the ground portion 123 of the connector 120 and the shield can 200.

The ground structure of a connector for a portable terminal according to the present invention as described above can improve receiving sensitivity during a mobile communication service according to noise reduction. Because there is no additional supply of materials for a ground of a connector, the number of processes capable of reducing a material cost can be reduced.

As mentioned previously, a ground structure of a connector for a portable terminal according to an embodiment of the present invention may include a structure for grounding a connector 120 to a shield can 200 to thereby reduce a noise occurring in the connector 120. The foregoing embodiments suggest several modifications of one side of the shield can 200 to ground the connector 120 by electrically coupling to a ground structure on the shield can 200. However, the present invention is not limited thereto. The shield can 200 can be further modified in various forms according to an arrangement or a construction of the connector 120, or a designer's intent. Accordingly, the ground structure of a connector for portable terminal according to the present invention is not limited to the modified forms of the shield can 200. Instead, it will be appreciated that the ground structure of a connector for a portable terminal according to the present invention that includes a ground portion 123 of the connector 120 is electrically connected to the shield can 200.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A ground apparatus for connecting components for a portable terminal, comprising:
   a connector engaging portion that is provided at one side of a main board;
   a connector that is inserted into the connector engaging portion, the connector comprising a ground portion
   a shield can that is disposed to cover the main board, the shield can comprising a ground structure formed at the connector engaging portion area to enclose the connector; and
   a gasket that is disposed to cover the ground structure and electrically couple the ground structure to the ground portion of the connector.

2. The ground apparatus of claim 1, wherein the ground structure comprises:
   a left protrusion extending from one side of the shield can parallel with a left sidewall of the connector; and
   a right protrusion extending from another side of the shield can parallel with a right sidewall of the connector such that the connector is inserted into the connector engaging portion between the left protrusion and the right protrusion.

3. The ground apparatus of claim 2, wherein the gasket is formed from a conductive material and electrically couples the left protrusion to the ground portion of the connector and the right protrusion.

4. The ground apparatus of claim 3, further comprising:
   a rear case in which the main board, the shield can, and the connector are disposed; and
   a front case engaging with the rear case and in which the gasket is disposed.

5. The ground apparatus of claim 1, wherein the shield can is formed from a stainless material that is conductive.

6. The ground apparatus of claim 1, wherein the connector electrically couples the main board to a display device.

7. The ground apparatus of claim 2, wherein the left protrusion and the right protrusion are formed to prevent the connector from moving after the connector is inserted into the connector engaging portion.

8. A ground apparatus for connecting components for a portable terminal, comprising:
   a connector engaging portion provided at one side of a main board;
   a connector inserted into the connector engaging portion, the connector comprising a ground portion; and a shield can disposed to cover the main board, the shield can comprising a ground structure formed at the connector engaging portion region to enclose the connector, and the ground structure being electrically coupled to the ground portion of the connector.

9. The ground apparatus of claim 8, wherein the ground structure comprises:
a reference protrusion disposed parallel with one sidewall of the connector;
a sidewall extension portion extending from an end of the reference protrusion in a direction substantially perpendicular to the one sidewall of the connector; and
a ground extension portion extending from an end of the sidewall extension portion such that the ground extension portion is electrically coupled to the ground portion of the connector.

10. The ground apparatus of claim 9, further comprising a gasket disposed to cover the ground extension portion and to press the ground extension portion against the ground portion of the connector.

11. The ground apparatus of claim 9, wherein the ground extension portion comprises at least one of a projection protruding to the ground portion of the connector and a bending portion bent toward the ground portion of the connector.

12. The ground apparatus of claim 8, wherein the ground structure comprises:
a left extension portion disposed parallel with a first sidewall of the connector;
a right extension portion disposed parallel with a second sidewall of the connector; and
a ground connecting portion that connects the right extension portion to the left extension portion and electrically couples to the ground portion of the connector such that the connector is inserted into the connector engaging portion between the left extension portion and the right extension portion.

13. The ground apparatus of claim 12, wherein the ground connecting portion comprises:
a left sub-extension portion extending from the left extension portion substantially perpendicular to the first sidewall of the connector;
a right sub-extension portion extending from the right extension portion substantially perpendicular to the second sidewall of the connector; and
a ground joint that couples the right sub-extension portion to the left sub-extension portion and electrically couples to the ground portion of the connector.

14. The ground apparatus of claim 13, further comprising a gasket disposed to cover the ground joint in a direction such that the ground joint presses against the ground portion of the connector.

15. The ground apparatus of claim 13, wherein the ground joint comprises a projection protruding toward the ground portion of the connector.

16. The ground apparatus of claim 13, wherein the ground joint is bent toward the ground portion of the connector.

17. The ground apparatus of claim 10, further comprising:
a rear case in which the main board, the shield can, and the connector are disposed; and
a front case engaging with the rear case and in which the gasket is disposed.

18. The ground apparatus of claim 14, further comprising:
a rear case in which the main board, the shield can, and the connector are disposed; and
a front case engaging with the rear case and in which the gasket is disposed.

19. The ground apparatus of claim 8, wherein the shield can is formed from a stainless material that is conductive.

20. The ground apparatus of claim 8, wherein the connector couples the main board to a display device.

* * * * *